United States Patent
Hsu et al.

(10) Patent No.: US 10,123,417 B2
(45) Date of Patent: Nov. 6, 2018

(54) DUAL PRINTED CIRCUIT BOARD ASSEMBLY, PRINTED CIRCUIT BOARD AND MODULAR PRINTED CIRCUIT BOARD

(71) Applicant: Wistron NeWeb Corp., Hsinchu (TW)

(72) Inventors: Cheng-Hsien Hsu, Hsinchu (TW);
Chih-Yuan Chiang, Hsinchu (TW);
Cheng-Huang Chen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 356 days.

(21) Appl. No.: 15/222,969

(22) Filed: Jul. 29, 2016

(65) Prior Publication Data
US 2017/0245366 A1   Aug. 24, 2017

(30) Foreign Application Priority Data
Feb. 19, 2016  (TW) .............................. 105105038 A

(51) Int. Cl.
*G01R 31/28* (2006.01)
*H05K 1/14* (2006.01)
(Continued)

(52) U.S. Cl.
CPC ......... *H05K 1/144* (2013.01); *G01R 31/2818* (2013.01); *H05K 1/0268* (2013.01);
(Continued)

(58) Field of Classification Search
CPC ........ H05K 1/144; H05K 1/0268; H05K 1/11; H05K 2201/042; H05K 2201/0776; G01R 31/2818; G01R 31/2812
See application file for complete search history.

(56) References Cited

U.S. PATENT DOCUMENTS

| | | | |
|---|---|---|---|
| 5,068,604 A | * | 11/1991 | Van de Lagemaat ........................ G01R 31/2853 324/537 |
| 6,028,431 A | * | 2/2000 | Hashida .............. G06F 11/1625 324/537 |

(Continued)

OTHER PUBLICATIONS

Components Corporation: FAQ—What are printed circuit board (PCB) test points? Copyright 2013. (Year: 2013).*

(Continued)

*Primary Examiner* — Jermele M Hollington
*Assistant Examiner* — Sean Curtis
(74) *Attorney, Agent, or Firm* — JCIPRNET

(57) ABSTRACT

A dual printed circuit board assembly, a printed circuit board, and a modular printed circuit board are provided. The printed circuit board includes a plurality of first connection points. The modular printed circuit board includes a plurality of second connection points. The modular printed circuit board is adapted to be mounted on the printed circuit board and includes a sensing unit, a first detecting unit, and a first notifying unit. The sensing unit outputs a detecting voltage according to a contact state between the first connection points and the second connection points. The first detecting unit determines whether the first connection points are respectively connected to the corresponding second connection points according to the detecting voltage. When one of the first connection points is not connected to the corresponding one of the second connection points, the first detecting unit controls the first notifying unit to issue a notification.

16 Claims, 7 Drawing Sheets

US 10,123,417 B2

Page 2

(51) Int. Cl.
*H05K 1/02* (2006.01)
*H05K 1/11* (2006.01)

(52) U.S. Cl.
CPC ............ *H05K 1/11* (2013.01); *G01R 31/2812* (2013.01); *H05K 2201/042* (2013.01); *H05K 2201/0776* (2013.01)

(56) References Cited

U.S. PATENT DOCUMENTS

| | | | | |
|---|---|---|---|---|
| 6,906,544 | B1* | 6/2005 | Shanker | G01R 31/2808 324/750.25 |
| 7,248,053 | B2* | 7/2007 | Houldsworth | G01R 31/04 320/106 |
| 7,525,319 | B1* | 4/2009 | Ahmed | G01R 31/046 324/538 |
| 7,737,701 | B2* | 6/2010 | Williamson | G01R 31/2812 324/527 |
| 7,741,834 | B2* | 6/2010 | Dang | G01R 31/2812 324/762.02 |
| 7,835,158 | B2* | 11/2010 | Kinsley | G01R 31/048 361/767 |
| 7,919,782 | B2* | 4/2011 | Hsu | G01R 31/026 257/89 |
| 8,013,334 | B2* | 9/2011 | Hsu | G01R 31/026 257/459 |
| 8,502,551 | B2* | 8/2013 | Yunoki | G01R 31/048 324/756.01 |
| 8,590,146 | B2* | 11/2013 | Kinsley | G01R 31/048 29/840 |
| 9,097,758 | B2* | 8/2015 | Fefer | G01R 31/2853 |
| 9,635,794 | B2* | 4/2017 | Babala | H05K 13/0465 |
| 9,827,629 | B2* | 11/2017 | Kinsley | G01R 31/048 |
| 2006/0012333 | A1* | 1/2006 | Houldsworth | G01R 31/04 320/107 |
| 2007/0152692 | A1* | 7/2007 | Kinsley | G01R 31/048 324/750.3 |
| 2008/0149947 | A1* | 6/2008 | Hsu | G01R 31/026 257/89 |
| 2009/0015278 | A1* | 1/2009 | Dang | G01R 31/2884 324/762.06 |
| 2009/0039911 | A1* | 2/2009 | Dang | G01R 31/2812 324/762.02 |
| 2009/0079440 | A1* | 3/2009 | Williamson | G01R 31/2812 324/612 |
| 2009/0230977 | A1* | 9/2009 | Vacar | G01R 31/2808 324/538 |
| 2010/0220455 | A1* | 9/2010 | Hsu | G01R 31/026 361/784 |
| 2010/0259289 | A1* | 10/2010 | Haridass | G01R 31/026 324/756.05 |
| 2011/0041317 | A1* | 2/2011 | Kinsley | G01R 31/048 29/593 |
| 2011/0095776 | A1* | 4/2011 | Yunoki | G01R 31/048 324/756.01 |
| 2013/0215591 | A1* | 8/2013 | Babala | H05K 13/0465 361/808 |
| 2014/0061285 | A1* | 3/2014 | Kinsley | G01R 31/048 228/180.22 |
| 2014/0375300 | A1* | 12/2014 | Tanaka | H05K 1/0268 324/76.11 |
| 2015/0095733 | A1* | 4/2015 | Pyeon | G01R 31/31713 714/734 |
| 2017/0245366 | A1* | 8/2017 | Hsu | G01R 31/2818 |

OTHER PUBLICATIONS

CheckSum: PCB Design guidelines for In-Circuit Test. Apr. 2012. (Year: 2012).*

* cited by examiner

DUAL PRINTED CIRCUIT BOARD ASSEMBLY, PRINTED CIRCUIT BOARD AND MODULAR PRINTED CIRCUIT BOARD

CROSS-REFERENCE TO RELATED APPLICATION

This application claims the priority benefit of Taiwan application serial no. 105105038, filed on Feb. 19, 2016. The entirety of the above-mentioned patent application is hereby incorporated by reference herein and made a part of this specification.

BACKGROUND OF THE INVENTION

Field of the Invention

The invention relates to a dual printed circuit board assembly, and in particular, a dual printed circuit board assembly, a printed circuit board, and a modular printed circuit board capable of inspecting a connection state.

Description of Related Art

The surface mounted technology (SMT) is a technology for welding electronic components onto a surface of a printed circuit board (PCB). Due to advantages including space saving, high reliability, being suitable for mass production and automation, and low production cost, the surface mounted technology has become the major technology adopted for producing printed circuit boards. The surface mounted technology involves printing solder paste on a surface of a bonding pad of a printed circuit board by using a solder paste printing machine and then disposing an electronic device at the bonding pad. The printed circuit board mounted with the solder paste and the electronic device needs to further undergo a reflow to melt the solder paste to bond the electronic device with the bonding pad of the printed circuit board, thereby completing the assembly and welding.

Similarly, a modular printed circuit board can also be welded onto the main printed circuit board through the surface mounted technology, such that the bonding pad at the bottom of the modular printed circuit board is connected to the bonding pad on the main printed circuit board through solder paste. However, the board warpage phenomenon may occur in the modular printed circuit board and/or the main printed circuit board due to the high-temperature environment or uneven pressure. If the board warpage phenomenon of the printed circuit board occurs in the production process, the device may fail to be bonded due to solder skips. On the other hand, regarding the modular printed circuit board and the main printed circuit board already installed in an electronic apparatus, the two printed circuit boards in the electronic apparatus may not be properly connected due to the cracked solder paste connection points caused by gradual deformation of either printed circuit board. In practice, it is even more difficult to dissemble a sold electronic apparatus to determine whether the board warpage phenomenon occurs in the printed circuit board.

SUMMARY OF THE INVENTION

In light of the above, the invention provides a dual printed circuit board assembly, a printed circuit board, and a modular printed circuit board, whereby the connection points between the printed circuit boards can be constantly tracked and inspected to thereby know the quality of electrical connection between the dual printed circuit boards.

The invention provides a dual printed circuit board assembly including a printed circuit board and a modular printed circuit board. The printed circuit board includes a plurality of first connection points and provides a supply voltage, wherein the first connection points are electrically connected to a reference voltage. The modular printed circuit board includes a plurality of second connection points respectively corresponding to the first connection points and receives the supply voltage. The modular printed circuit board is adapted to be mounted on the printed circuit board and includes a sensing unit, a first detecting unit, and a first notifying unit. The sensing unit is electrically connected to the second connection points, receives an input voltage, and outputs a detecting voltage according to a contact state between the first connection points and the second connection points. The first detecting unit is electrically connected to the sensing unit, receives the detecting voltage, and determines whether the first connection points are respectively connected to the corresponding second connection points according to the detecting voltage. The first notifying unit is electrically connected to the first detecting unit. When one of the first connection points is not connected to the corresponding one of the second connection points, the first detecting unit controls the first notifying unit to issue a notification.

The invention provides a printed circuit board, of which a surface is adapted to be mounted with a modular printed circuit board. The printed circuit board provides a supply voltage to the modular printed circuit board, and the printed circuit board includes a plurality of first connection points, a sensing unit, a detecting unit, and a notifying unit. The first connection points respectively correspond to a plurality of second connection points of the modular printed circuit board, wherein the second connection points are electrically connected to a reference voltage. The sensing unit is electrically connected to the first connection points, receives an input voltage, and outputs a detecting voltage according to a contact state between the first connection points and the second connection points. The detecting unit is electrically connected to the sensing unit, receives the detecting voltage, and determines whether the first connection points are respectively connected to the corresponding second connection points according to the detecting voltage. The notifying unit is electrically connected to the detecting unit. When one of the first connection points is not connected to the corresponding one of the second connection points, the first detecting unit controls the first notifying unit to issue a notification.

The invention provides a modular printed circuit board adapted to be mounted on a surface of a printed circuit board to receive a supply voltage provided by the printed circuit board. The printed circuit board includes a plurality of first connection points. The modular printed circuit board includes a plurality of second connection points, a sensing unit, a detecting unit, and a notifying unit. The second connection points respectively correspond to the first connection points of the printed circuit board, wherein the first connection points are electrically connected to a reference voltage. The sensing unit is electrically connected to the second connection points, receives an input voltage, and outputs a detecting voltage according to a contact state between the first connection points and the second connection points. The detecting unit is electrically connected to the sensing unit, receives the detecting voltage, and determines whether the first connection points are respectively connected to the corresponding second connection points according to the detecting voltage. The notifying unit is electrically connected to the detecting unit. When one of the first connection points is not connected to the corresponding one of the second connection points, the first detecting unit controls the first notifying unit to issue a notification.

In light of the above, in the dual printed circuit board assembly, the printed circuit board, and the modular printed circuit board of the disclosure, through the configuration of the sensing unit, once abnormality occurs in the connection between the connection points of the modular printed circuit board and the corresponding connection points on the main printed circuit board, a variation occurs in the detecting voltage outputted by the sensing unit. Accordingly, based on the variation in the detecting voltage, the detecting unit can instantly inspect which connection point on the modular printed circuit board is not normally connected to the corresponding connection point on the printed circuit board, such that the maintenance staff can infer whether the board warpage phenomenon of the printed circuit board or the cracking phenomenon of the solder paste connection points exists.

To provide a further understanding of the aforementioned and other features and advantages of the invention, exemplary embodiments, together with the reference drawings, are described in detail below.

DESCRIPTION OF THE EMBODIMENTS

Figure 1:
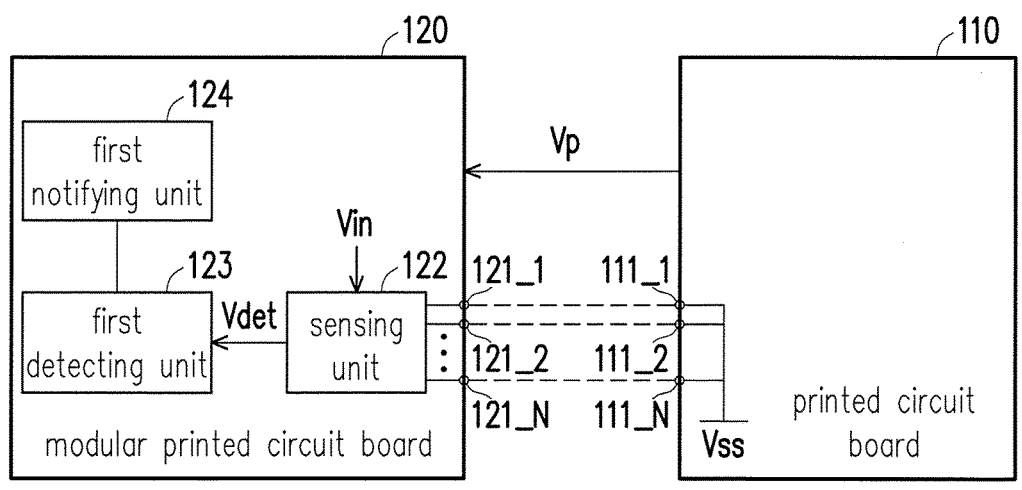
FIG. 1 is a schematic diagram illustrating a dual printed circuit board assembly according to one embodiment of the invention.

FIG. 1 is a schematic diagram illustrating a dual printed circuit board assembly according to one embodiment of the invention. The dual printed circuit board assembly 10 includes a printed circuit board 110 and a modular printed circuit board 120. The printed circuit board 110 may be a main printed circuit board mounted with various electronic devices, processor chips, memory chips, connectors, or slots in an electronic apparatus. Generally, electronic apparatuses of any type (e.g., mobile phones, computers, gaming consoles, cameras, printers, servers, etc.) have a main printed circuit board inside that is mounted with various electronic devices. The modular printed circuit board 120 is a modular electronic device assembly configured to provide a specific function. In an example where the modular printed circuit board 120 can provide a communication function, the modular printed circuit board 120 includes, for example, devices such as a circuit carrier board, a chip having a Communication function, an antenna, etc.

The printed circuit board 110 includes an N-number of first connection points 111_1 to 111_N (wherein N is an integer greater than 1) and provides a supply voltage Vp. The first connection points 111_1 to 111_N are electrically connected to a reference voltage Vss. The modular printed circuit board 120 includes an N-number of second connection points 121_1 to 121_N respectively corresponding to the first connection points 111_1 to 111_N and receives the supply voltage Vp. The modular printed circuit board 120 is adapted to be mounted on the printed circuit board 110. Specifically, in FIG. 2B, the modular printed circuit board 120 includes a first surface S1 and a second surface S2. The second connection points 121_1 to 121_N on the second surface S2 are connected to a circuit on the first surface S1 via a metal conductor in the circuit carrier board. The modular printed circuit board 120 may be welded onto the printed circuit board 110 through the surface mounted technology (SMT). The second connection points 121_1 to 121_N on the second surface S2 are respectively connected to the corresponding first connection points 111_1 to 111_N. It should be mentioned that in addition to the first connection points 111_1 to 111_N and the second connection points 121_1 to 121_N, the printed circuit board 110 and the modular printed circuit board 120 may be further connected to each other via other connection points to transmit electric signals via the other connection points connected to each other.

Figure 2A:
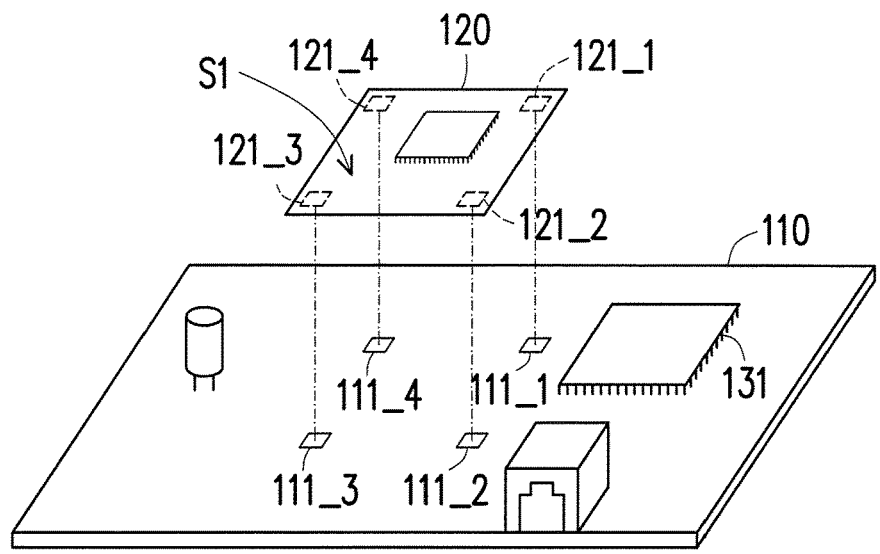
FIG. 2A is a perspective schematic diagram illustrating a dual printed circuit board assembly according to one embodiment of the invention.
Figure 2B:
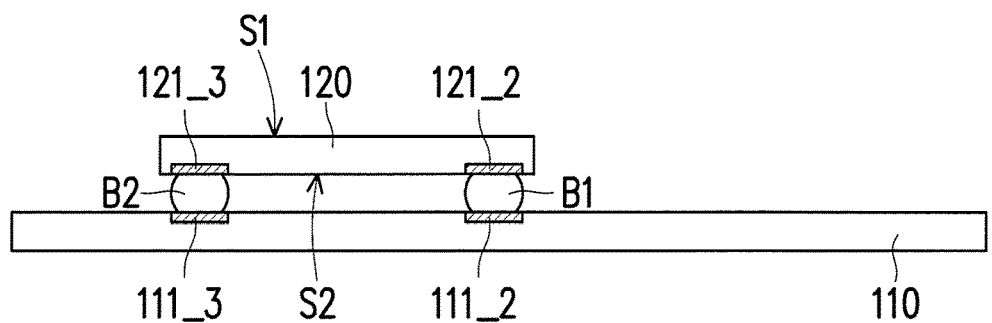
FIG. 2B is a side-view schematic diagram illustrating a dual printed circuit board assembly according to one embodiment of the invention.

To describe the connection structure of the printed circuit board and the modular printed circuit board, FIG. 2A is a perspective schematic diagram illustrating a dual printed circuit board assembly according to one embodiment of the invention. FIG. 2B is a side-view schematic diagram illustrating a dual printed circuit board assembly according to one embodiment of the invention. Referring to FIG. 2A and FIG. 2B, the shape of the modular printed circuit board is rectangular, but the invention is not limited hereto. In addition, it is supposed here that N=4, but the invention is not limited hereto. The printed circuit board 110 is welded with a plurality of electronic devices (e.g., a processor chip 131) and includes first connection points 111_1 to 111_4. The second surface S2 of the modular printed circuit board 120 includes second connection points 121_1 to 121_4. Ideally, the first connection points 111_1 to 111_4 and the second connection points 121_1 to 121_4 are connected to each other via a hardened solder paste.

When the modular printed circuit board 120 is placed on the printed circuit board 110, the second connection points 121_1 to 121_4 are respectively right on the first connection point 111_1 to 111_4. Referring to FIG. 2B, ideally, the second connection point 121_2 and the first connection point 111_2 are connected to each other via a hardened solder paste B1, and the second connection point 121_3 and the first connection point 111_3 are connected to each other via a hardened solder paste B2.

Refer to FIG. 1, the modular printed circuit board 120 includes a sensing unit 122, a first detecting unit 123, and a first notifying unit 124. The sensing unit 122 is electrically connected to the second connection points 121_1 to 121_N. The sensing unit 122 receives an input voltage Vin which is provided by the supply voltage Vp and outputs a detecting voltage Vdet according to a contact state between the first connection points 111_1 to 111_N and the second connection points 121_1 to 121_N. The first detecting unit 123 is electrically connected to the sensing unit 122 to receive the detecting voltage Vdet and determine whether the first connection points 111_1 to 111_N are respectively connected to the corresponding second connection points 121_1 to 121_N according to the detecting voltage Vdet. In other words, the first detecting unit 123 of the present embodiment can inspect the quality of electrical connection between the first connection points 111_1 to 111_N and the second connection points 121_1 to 121_N according to a variation in the detecting voltage Vdet.

The first notifying unit 124 is electrically connected to the first detecting unit 123. When one of the first connection points 111_1 to 111_N is not connected to the corresponding one of the second connection points 121_1 to 121_N, the first detecting unit 123 controls the first notifying unit 124 to issue a notification. The first notifying unit 124 may include a light-emitting or sound-emitting device, a communication device, or a combination thereof. The notification issued by the first notifying unit 124 includes a warning light or a warning sound generated by the light-emitting or sound-emitting device, a warning message transmitted through the communication device, or a combination thereof. For example, the first notifying unit 124 may be a light-emitting diode, a speaker, a radio frequency communication device, an Ethernet device, etc., but the invention is not limited hereto. In other words, once one of the first connection points 111_1 to 111_N is not connected to the corresponding one of the second connection points 121_1 to 121_N, the first notifying unit 124 instantly issues a notification to allow people to timely discover that an abnormal phenomenon occurs in the connection between the printed circuit board 110 and the modular printed circuit board 120.

Figure 3:
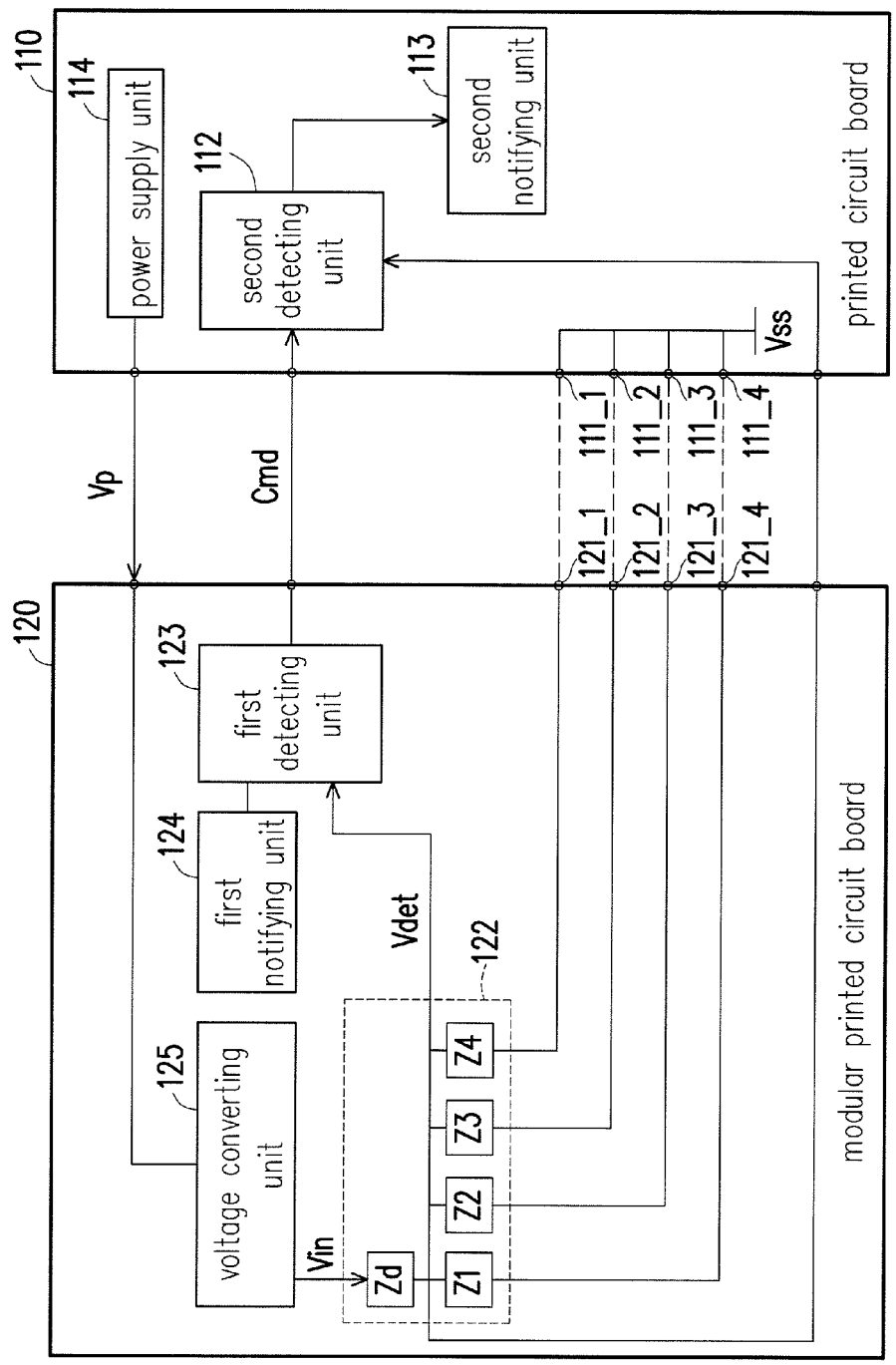
FIG. 3 is a schematic diagram illustrating a dual printed circuit board assembly according to one embodiment of the invention.

FIG. 3 is a schematic diagram illustrating a dual printed circuit board assembly according to one embodiment of the invention. It should be noted that the present embodiment is exemplified with 4 first connection points and 4 second connection points, but the invention is not limited hereto. Referring to FIG. 3, in the present embodiment, the printed circuit board 110 includes a power supply unit 114, and the modular printed circuit board 120 further includes a voltage converting unit 125. The voltage converting unit 125 receives the supply voltage Vp and generates an input voltage Vin according to the supply voltage Vp. For example, the voltage converting unit 125 may convert a supply voltage Vp which is 5V into an input voltage Vin which is 1.8V.

In the present embodiment, the sensing unit 122 includes a voltage-dividing impedance component Zd and a plurality of impedance detecting components Z1 to Z4 connected parallel to each other. The voltage-dividing impedance component Zd and the impedance detecting components Z1 to Z4 are, for example, resistors, transistors, or a combination thereof, but the invention is not limited hereto. A first end of the voltage-dividing impedance component Zd receives the input voltage Vin, and a second end of the voltage-dividing impedance component Zd outputs the detecting voltage Vdet. A first end of each of the impedance detecting components Z1 to Z4 is connected to the second end of the voltage-dividing impedance component Zd, and a second end of each of the impedance detecting components Z1 to Z4 is connected to the second connection points 121_1 to 121_4. Moreover, the first connection points 111_1 to 111_4 are electrically connected to the reference voltage Vss.

It follows that when the first connection points 111_1 to 111_4 are respectively connected to the corresponding second connection points 121_1 to 121_4, the detecting voltage Vdet is maintained at a specific level. When one of the second connection points 121_1 to 121_4 is not connected to the corresponding second connection points 121_1 to 121_4, a variation in the level of the detecting voltage Vdet occurs. Accordingly, through the level of the detecting voltage Vdet, the first detecting unit 123 can determine whether all of the first connection points 111_1 to 111_4 are connected to the corresponding second connection points 121_1 to 121_4 appropriately. As a result, the situation where any one of the second connection points 121_1 to 121_4 fails to be connected to the first connection points 111_1 to 111_4 due to warpage of the modular printed circuit board 120 can be instantly inspected by the first detecting unit 123.

On the other hand, in the present embodiment, the printed circuit board 110 further includes a second notifying unit 113 and a second detecting unit 112. The second notifying unit 113 and the second detecting unit 112 are similar to the first notifying unit 124 and the first detecting unit 123. The second detecting unit 112 is electrically connected to the sensing unit 122 to receive the detecting voltage Vdet. The second detecting unit 112 is electrically connected to the second notifying unit 113 and is connected to the first detecting unit 123. The first detecting unit 123 is able to detect whether the modular printed circuit board 120 is in a normal state. When the first detecting unit 123 issues a preparation signal Cmd to the second detecting unit 112 in response to an abnormal state, the second detecting unit 112 determines whether the first connection points 111_1 to 111_4 are respectively connected to the second connection points 121_1 to 121_4 according to the detecting voltage Vdet, and thereby determines whether to control the second notifying unit 113 to issue a notification. The preparation signal Cmd is, for example, an electric signal at a specific level or a serial code string, but the invention is not limited hereto. Accordingly, when the first detecting unit 123 or the first notifying unit on the modular printed circuit board 120 fails, the spare second notifying unit 113 and the second detecting unit 112 can continue to detect the state of electrical connection between the connection points.

It follows that when the first connection points 111_1 to 111_4 are all normally connected to the second connection points 121_1 to 1214, the detecting voltage Vdet is maintained at a first predetermined voltage. In one embodiment, when the detecting voltage Vdet does not match the first predetermined voltage, the first detecting unit 123 controls the first notifying unit 124 to issue a notification. Moreover, by configuring the impedance detecting components Z1 to Z4 to have different impedances, the first detecting unit 123 can further determine whether at least one target connection point among the second connection points 121_1 to 121_4 is not connected to the corresponding one of the first connection points 111_1 to 111_4 according to the detecting voltage Vdet and a plurality of second predetermined voltages. According to the impedances of the voltage-dividing impedance component Zd and the impedance detecting components Z1 to Z4 and the configuration of the input voltage Vin, the plurality of the second predetermined voltages can be evaluated in advance with respect to various connection states between the first connection points 111_1 to 111_4 and the second connection points 121_1 to 121_4.

In addition, in one embodiment, the first detecting unit 123 may be a microcontroller unit (MCU), and the microcontroller unit determines whether the detecting voltage Vdet is at a low level or high level according to a predefined logical determination voltage level Vth. When any one of the first connection points 111_1 to 111_4 is not connected to the corresponding second connection point, the detecting voltage Vdet increases. Accordingly, when the detecting voltage Vdet is switched from the low level to the high level, the microcontroller unit controls the first notifying unit 124 to issue a notification.

In addition, in one embodiment, the first detecting unit 123 includes an analog-digital converting circuit. The analog-digital converting circuit converts the detecting voltage Vdet into a digital data and determines whether to control the first notifying unit 125 to issue a notification according to the digital data whether matches a predetermined digital data. It should be mentioned that the analog-digital converting circuit may determine whether at least one target connection point among the second connection points 121_1 to 121_4 is not connected to the corresponding one of the first connection points 111_1 to 111_4 according to the digital data and a plurality of second predetermined digital data.

For example, when the first connection points 111_1 to 111_4 are all normally connected to the second connection points 121_1 to 121_4, the detecting voltage Vdet is maintained at the first predetermined voltage. The analog-digital converting circuit may convert the first predetermined voltage into a digital data '0000' and controls the first notifying unit 125 not to issue a notification according to the digital data '0000'. For example, when the first connection point 111_1 is not normally connected to the second connection point 121_1, the detecting voltage Vdet is maintained at the second predetermined voltage. The analog-digital converting circuit may convert the second predetermined voltage into a digital data '0001', and the first detecting unit 123 determines that abnormality occurs in the connection state of the second connection point 121_1 according to the digital data '0001', and further controls the first notifying unit 125 to issue a notification.

However, the digital data '0000' and '0001' above are for illustrative purposes only and are not intended to limit the invention. In another embodiment, the analog-digital converting circuit may be an analog-digital converter having a resolution of 10 bits that can quantify the level of the detecting voltage Vdet as one level of $2^{10}=1024$ levels and directly output a corresponding output code according to the level number obtained from quantification. Accordingly, the 10 bit analog-digital converter can determine the connection state between the first connection points 111_1 to 111_4 and the second connection points 121_1 to 121_4 by using the output code. However, the resolution of the analog-digital converter may be configured according to the actual needs and application, and the invention is not limited hereto.

Figure 4A:
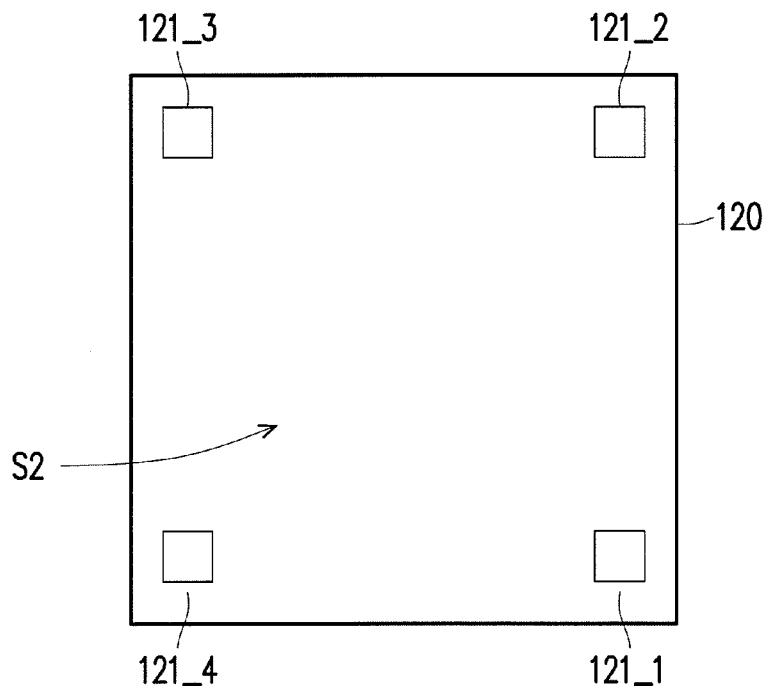
FIGS. 4A to 4C are schematic diagrams illustrating arrangements of positions of connections points on a modular printed circuit board according to one embodiment of the invention.
Figure 4B:
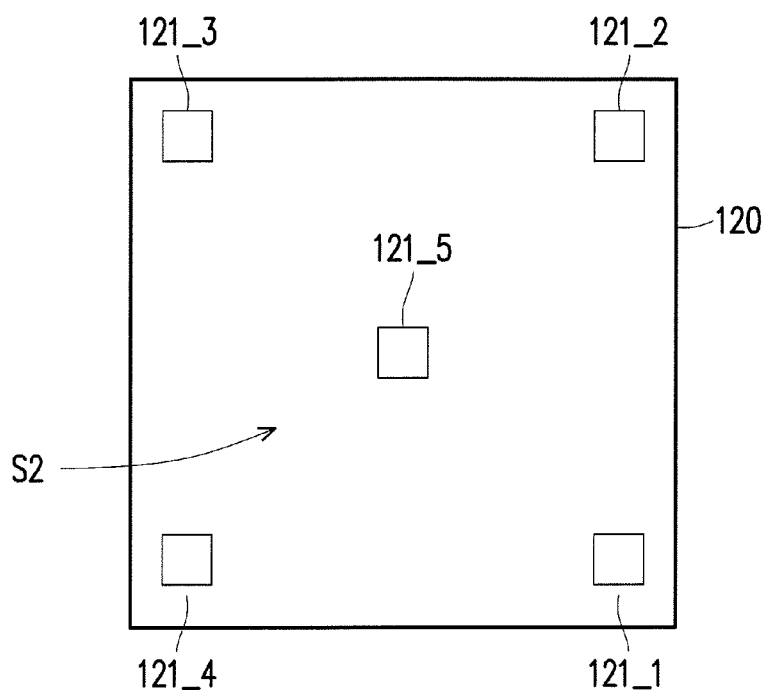
Figure 4C:
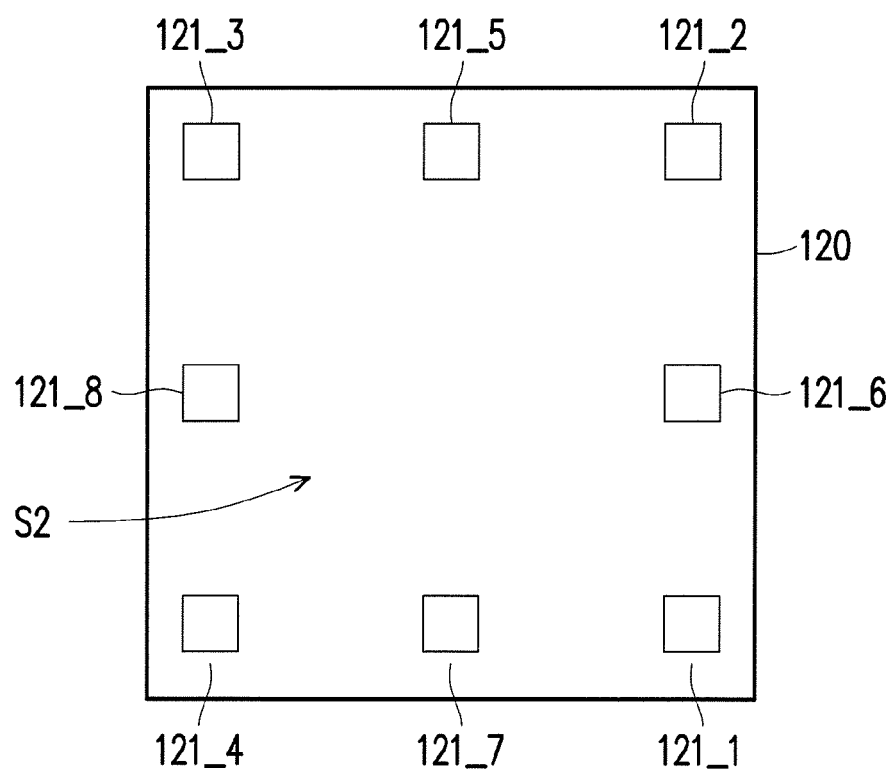

In light of the above, to inspect the phenomenon of printed circuit board warpage in the modular printed circuit board, the second connection points on the modular printed circuit board shall be disposed at positions on the modular printed circuit board where board warpage or board bending is most likely to occur, e.g., corners of the modular printed circuit board. Accordingly, the phenomenon of printed circuit board warpage in the modular printed circuit board can be more precisely and instantly detected. FIGS. 4A, 4B, and 4C are schematic diagrams illustrating different arrangements of positions of connection points on a modular printed circuit board according to a plurality of embodiments of the invention. Referring to FIG. 4A, the second connection points 121_1 to 121_4 of the modular printed circuit board 120 are disposed on a plurality of corners of the second surface S2. Referring to FIG. 4B, the second connection points 121_1 to 121_4 of the modular printed circuit board 120 are disposed on a plurality of corners of the second surface S2, and a second connection point 121_5 is disposed at a center of the second surface S2. Referring to FIG. 4C, the second connection points 121_1 to 121_4 of the modular printed circuit board 120 are disposed on a plurality of corners of the second surface S2, and second connection points 121_5 to 121_8 are disposed on a plurality of edges of the second surface S2.

Figure 5:
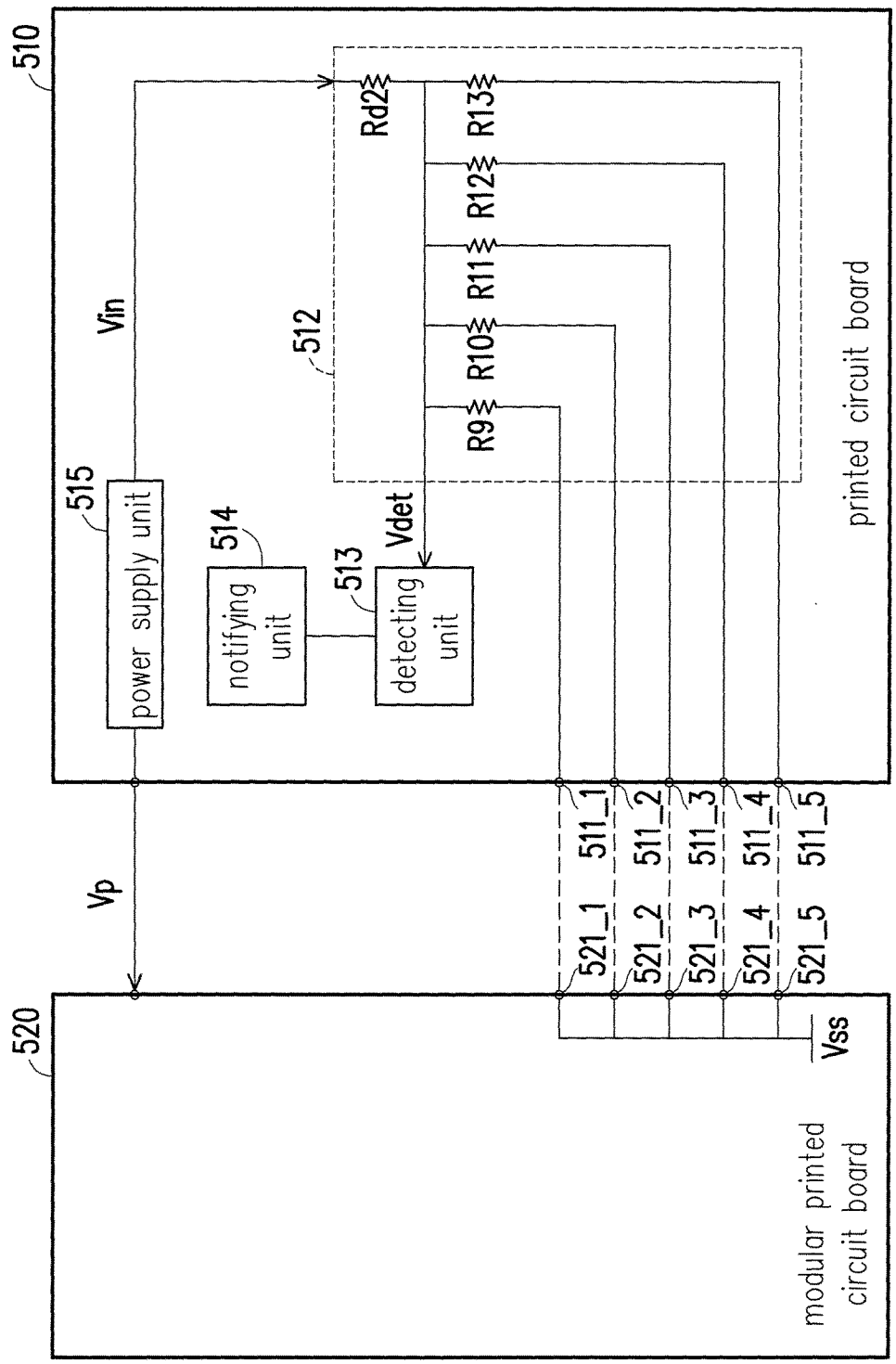
FIG. 5 is a schematic diagram illustrating a dual printed circuit board assembly according to one embodiment of the invention.

FIG. 5 is a schematic view illustrating a dual printed circuit board assembly according to one embodiment of the invention. Compared with the embodiments illustrated in FIG. 1 and FIG. 3, in the present embodiment, the sensing unit 512 is disposed on the main printed circuit board providing the supply voltage. In the present embodiment, it is supposed that there are 5 first connection points and 5 second connection points; and the voltage-dividing impedance component and the impedance detecting components are respectively resistors having different resistances. However, the invention is not limited hereto.

Referring to FIG. 5, a surface of a printed circuit board 510 is adapted to be mounted with a modular printed circuit board 520. The printed circuit board 510 provides a supply voltage Vp to the modular printed circuit board 520. The printed circuit board 510 includes a plurality of first connection points 511_1 to 511_5, a sensing unit 512, a detecting unit 513, and a notifying unit 514. The first connection points 511_1 to 511_5 respectively correspond to a plurality of second connection points 521_1 to 521_5 of the modular printed circuit board 520. The second connection points 521_1 to 521_5 are electrically connected to a reference voltage Vss and are located, for example, on corners and a center of the modular printed circuit board 520 as in the example illustrated in FIG. 4B. The sensing unit 512 is electrically connected to the first connection points 511_1 to 511_5, receives an input voltage Vin, and outputs a detecting voltage Vdet according to a contact state between the first connection points 511_1 to 511_5 and the second connection points 521_1 to 521_5.

The sensing unit 512 includes a voltage-dividing resistor Rd2 and detecting resistors R9 to R13 connected parallel to each other. One end of the voltage-dividing resistor Rd2 receives the input voltage Vin provided by a power supply unit 515. The other end of the voltage-dividing resistor Rd2 outputs the detecting voltage Vdet. One end of each of the detecting resistors R9 to R13 is respectively connected to the voltage-dividing resistor Rd2. The other end of each of the detecting resistors R9 to R13 is respectively connected to the corresponding first connection points 511_1 to 511_5.

The detecting unit 513 is electrically connected to the sensing unit 512 to receive the detecting voltage Vdet and determine whether the first connection points 511_1 to 511_5 are respectively connected to the corresponding second connection points 521_1 to 521_5 according to the detecting voltage Vdet. The notifying unit 514 is electrically connected to the detecting unit 513. When one of the first connection points 511_1 to 511_5 is not connected to the corresponding one of the second connection points 521_1 to 521_5, the detecting unit 513 controls the notifying unit 514 to issue a notification.

Figure 6:
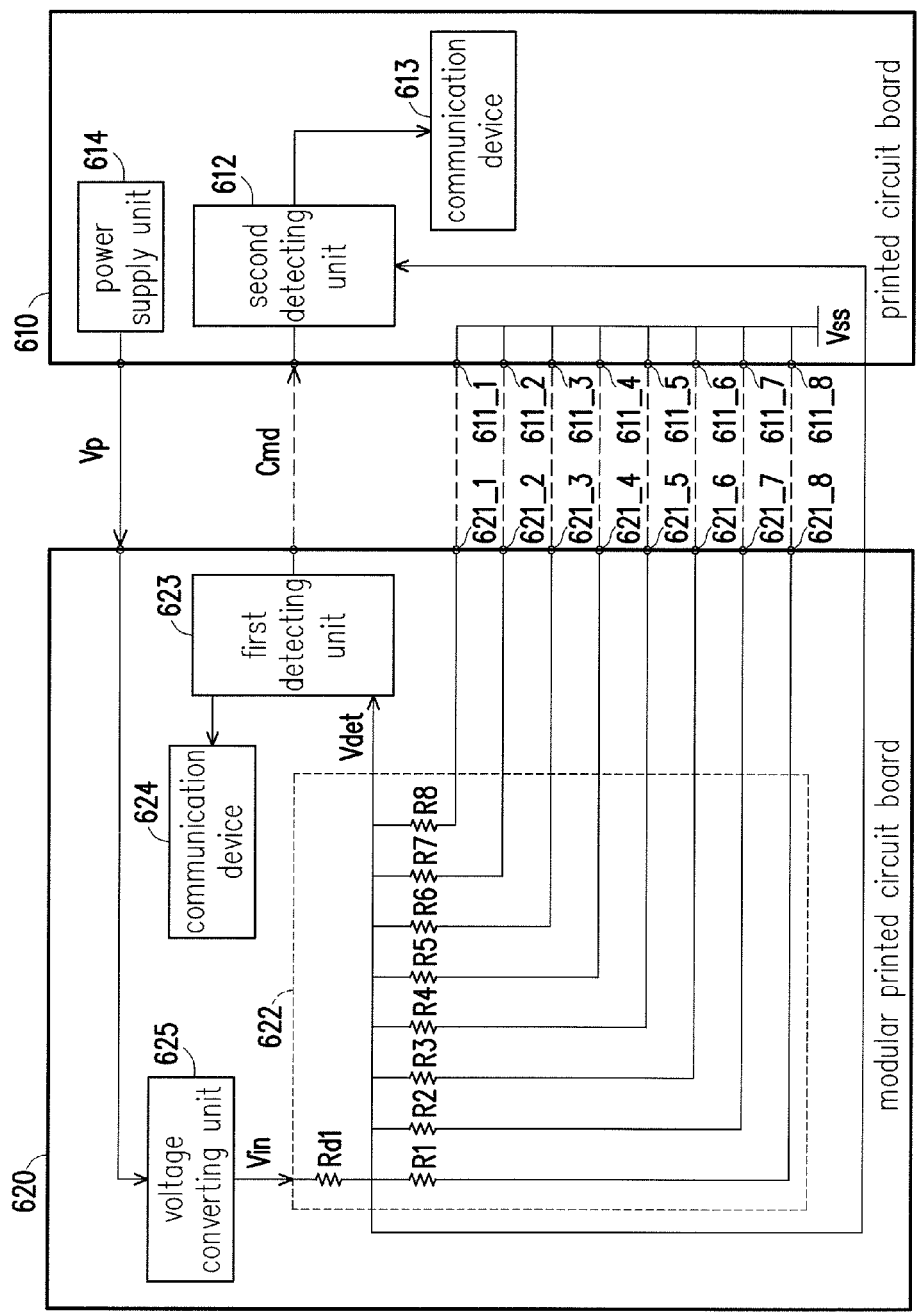
FIG. 6 is a schematic diagram illustrating a dual printed circuit board assembly according to one embodiment of the invention.

FIG. 6 is a schematic diagram illustrating a dual printed circuit board assembly according to one embodiment of the invention. In the present embodiment, it is supposed that there are 8 first connection points and 8 second connection points, and the voltage-dividing impedance component and the impedance detecting components are respectively resistors having different resistances. However, the invention is not limited hereto.

Referring to FIG. 6, a surface of a printed circuit board 610 is adapted to be mounted with a modular printed circuit board 620. The printed circuit board 610 provides a supply voltage Vp to the modular printed circuit board 620. The printed circuit board 610 includes a plurality of first connection points 611_1 to 611_8, a second detecting unit 612, and a communication device 613.

The printed circuit board 610 includes a plurality of first connection points 611_1 to 611_8 electrically connected to a reference voltage Vss. The modular printed circuit board 620 includes the second connection points 621_1 to 621_8 are located, for example, on corners and edges of a bottom surface of the modular printed circuit board 620 as in the example illustrated in FIG. 4C. The first connection points 611_1 to 611_8 respectively correspond to the plurality of second connection points 621_1 to 621_8 of the modular printed circuit board 620. The modular printed circuit board 620 further includes a sensing unit 622, a first detecting unit 623, a communication device 624, and a voltage converting unit 625.

The sensing unit 622 includes a voltage-dividing resistor Rd1 and detecting resistors R1 to R8 connected parallel to each other. One end of the voltage-dividing resistor Rd1 receives an input voltage Vin provided by the voltage converting unit 625. The other end of the voltage-dividing resistor Rd1 outputs a detecting voltage Vdet. With the resistors R1 to R8 having different resistances, the detecting voltage Vdet may have a corresponding voltage-dividing level in response to whether the first connection points 611_1 to 611_8 are connected to the second connection points 621 1 to 621_8. Accordingly, the first detecting unit 623 can inspect the state of electrical connection between the first connection points 611_1 to 611_8 and the second connection points 621_1 to 621_8 based on the detecting voltage Vdet. Once the first detecting unit 623 determines that at least one target connection point among the second connection points 621_1 to 621_8 is not connected to the first connection points, the first detecting unit 623 can control the communication device 624 to issue a warning message to other external electronic apparatuses.

On the other hand, when an abnormal state occurs in the modular printed circuit board 620, the first detecting unit 623 may issue a preparation message Cmd to the second detecting unit 612. Accordingly, the second detecting unit 612 can similarly inspect the state of electrical connection between the first connection points 611_1 to 611_8 and the second connection points 621_1 to 621_8 based on the detecting voltage Vdet.

In summary of the above, in the embodiments of the invention, through detecting the detecting voltage outputted by the sensing unit, the quality of electrical connection between the connection points on the modular printed circuit board and the corresponding connection points on the printed circuit board can be constantly inspected. Once abnormality occurs in the connection between the connection points of the modular printed circuit board and the corresponding connection points on the main printed circuit board, a variation occurs in the detecting voltage outputted by the sensing unit. Accordingly, based on the level of the detecting voltage, the invention not only can instantly detect whether the connection points between the modular printed circuit board and the main printed circuit board are normally connected, but can thereby inspect at which connection points the abnormality occurs. As a result, the board warpage phenomenon of the printed circuit board and the cracking phenomenon of the solder paste connection points can be rapidly and easily inspected so as to prevent abnormalities in electronic apparatuses arising from non-detection of the foregoing phenomena and thereby enhance the reliability of electronic apparatuses involving personal safety.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A dual printed circuit board assembly comprising:
 a printed circuit board comprising a plurality of first connection points, the printed circuit board providing a supply voltage, wherein the first connection points are electrically connected to a reference voltage; and
 a modular printed circuit board comprising a plurality of second connection points respectively corresponding to the first connection points, the modular printed circuit board receiving the supply voltage, and the modular printed circuit board being adapted to be mounted on the printed circuit board and comprising:
  a sensing unit electrically connected to the second connection points, receiving an input voltage, and outputting a detecting voltage according to a contact state between the first connection points and the second connection points;
  a first detecting unit electrically connected to the sensing unit, receiving the detecting voltage, and determining whether the first connection points are respectively connected to the corresponding second connection points according to the detecting voltage; and
  a first notifying unit electrically connected to the first detecting unit, wherein the first detecting unit controls the first notifying unit to issue a notification when one of the first connection points is not connected to the corresponding one of the second connection points.

2. The dual printed circuit board assembly according to claim 1, wherein the modular printed circuit board comprises a first surface and a second surface, wherein the second connection points are disposed on a plurality of corners of the second surface.

3. The dual printed circuit board assembly according to claim 2, wherein the second connection points are disposed on a plurality of edges of the second surface.

4. The dual printed circuit board assembly according to claim 1, wherein the sensing unit comprises:
 a voltage-dividing impedance component, wherein a first end of the voltage-dividing impedance component receives the input voltage and a second end of the voltage-dividing impedance component outputs the detecting voltage; and
 a plurality of impedance detecting components connected parallel to each other, wherein a first end of each of the impedance detecting components is connected to the second end of the voltage-dividing impedance component, and a second end of each of the impedance detecting components is connected to one of the second connection points.

5. The dual printed circuit board assembly according to claim 1, wherein the first detecting unit controls the first notifying unit to issue the notification when the detecting voltage does not match a first predetermined voltage.

6. The dual printed circuit board assembly according to claim 5, wherein the first detecting unit determines whether at least one target connection point among the second connection points is not connected to the corresponding one of the first connection points according to the detecting voltage and a plurality of second predetermined voltages, and each of the impedance detecting components has a different impedance.

7. The dual printed circuit board assembly according to claim 1, wherein the first detecting unit comprises an analog-digital converting circuit, and the analog-digital converting circuit converts the detecting voltage into a digital data and the first detecting unit determines whether to control the first notifying unit to issue the notification according to the digital data,
wherein the first detecting unit determines whether at least one target connection point among the second connection points is not connected to the corresponding one of the first connection points according to the digital data and a plurality of predetermined digital data.

8. The dual printed circuit board assembly according to claim 1, wherein the printed circuit board comprises:
a second notifying unit; and
a second detecting unit electrically connected to the sensing unit to receive the detecting voltage, electrically connected to the second notifying unit, and connected to the first detecting unit, wherein the second detecting unit determines whether the first connection points are respectively connected to the second connection points according to the detecting voltage and determines whether to control the second notifying unit to issue a notification, when the first detecting unit issues a preparation signal to the second detecting unit in response to an abnormal state.

9. A printed circuit board, wherein a surface of the printed circuit board is adapted to be mounted with a modular printed circuit board, and the printed circuit board provides a supply voltage to the modular printed circuit board, the printed circuit board comprising:
a plurality of first connection points respectively corresponding to a plurality of second connection points of the modular printed circuit board, wherein the second connection points are electrically connected to a reference voltage;
a sensing unit electrically connected to the first connection points, receiving an input voltage, and outputting a detecting voltage according to a contact state between the first connection points and the second connection points;
a detecting unit electrically connected to the sensing unit, receiving the detecting voltage, and determining whether the first connection points are respectively connected to the corresponding second connection points according to the detecting voltage; and
a notifying unit electrically connected to the detecting unit, wherein the detecting unit controls the notifying unit to issue a notification when one of the first connection points is not connected to the corresponding one of the second connection points.

10. The printed circuit board according to claim 9, wherein the sensing unit comprises:
a voltage-dividing impedance component, wherein a first end of the voltage-dividing impedance component receives the input voltage and a second end of the voltage-dividing impedance component outputs the detecting voltage; and
a plurality of impedance detecting components connected parallel to each other, wherein a first end of each of the impedance detecting components is connected to the second end of the voltage-dividing impedance component, and a second end of each of the impedance detecting components is connected to one of the first connection points.

11. The printed circuit board according to claim 9, wherein the detecting unit controls the notifying unit to issue the notification when the detecting voltage does not match a first predetermined voltage.

12. The printed circuit board according to claim 11, wherein the detecting unit determines whether at least one target connection point among the second connection points is not connected to the corresponding one of the first connection points according to the detecting voltage and a plurality of second predetermined voltages, and each of the impedance detecting components has a different impedance.

13. The printed circuit board according to claim 9, wherein the detecting unit is an analog-digital converting circuit, and the analog-digital converting circuit converts the detecting voltage into a digital data and determines whether to control the notifying unit to issue the notification according to the digital data.

14. A modular printed circuit board adapted to be mounted on a surface of a printed circuit board to receive a supply voltage provided by the printed circuit board, wherein the printed circuit board comprises a plurality of first connection points, the modular printed circuit board comprising:
a plurality of second connection points respectively corresponding to the first connection points of the printed circuit board, wherein the first connection points are electrically connected to a reference voltage;
a sensing unit electrically connected to the second connection points, receiving an input voltage, and outputting a detecting voltage according to a contact state between the first connection points and the second connection points;
a detecting unit electrically connected to the sensing unit, receiving the detecting voltage, and determining whether the first connection points are respectively connected to the corresponding second connection points according to the detecting voltage; and
a notifying unit electrically connected to the detecting unit, wherein the detecting unit controls the notifying unit to issue a notification when one of the first connection points is not connected to the corresponding one of the second connection points.

15. The modular printed circuit board according to claim 14, wherein the modular printed circuit board comprises a first surface and a second surface, wherein the second connection points are disposed on a plurality of corners of the second surface.

16. The modular printed circuit board according to claim 15, wherein the second connection points are disposed on a plurality of edges of the second surface.

* * * * *